United States Patent
Yen et al.

(10) Patent No.: US 10,379,924 B2
(45) Date of Patent: *Aug. 13, 2019

(54) DATA STORAGE DEVICE AND DATA MAINTENANCE METHOD THEREOF

(71) Applicant: Silicon Motion, Inc., Jhubei (TW)

(72) Inventors: Chia-Han Yen, Taipei (TW); Hung-Ta Hsu, Kaohsiung (TW)

(73) Assignee: Silicon Motion, Inc., Jhubei (TW)

( * ) Notice: Subject to any disclaimer, the term of this patent is extended or adjusted under 35 U.S.C. 154(b) by 297 days.

This patent is subject to a terminal disclaimer.

(21) Appl. No.: 15/442,181

(22) Filed: Feb. 24, 2017

(65) Prior Publication Data

US 2017/0161135 A1 Jun. 8, 2017

Related U.S. Application Data

(63) Continuation of application No. 14/569,442, filed on Dec. 12, 2014, now Pat. No. 9,620,245.

(30) Foreign Application Priority Data

Dec. 17, 2013 (TW) .............................. 102146529 A

(51) Int. Cl.
*G11C 29/00* (2006.01)
*G06F 11/07* (2006.01)
(Continued)

(52) U.S. Cl.
CPC .......... *G06F 11/0727* (2013.01); *G06F 3/064* (2013.01); *G06F 3/0619* (2013.01); *G06F 3/0653* (2013.01); *G06F 3/0679* (2013.01); *G06F 11/076* (2013.01); *G06F 11/0757* (2013.01); *G06F 11/0793* (2013.01);
(Continued)

(58) Field of Classification Search
CPC ..... G11C 29/52; G11C 29/42; G11C 29/4401; G11C 16/3418; G11C 16/3495; G06F 11/1048
See application file for complete search history.

(56) References Cited

U.S. PATENT DOCUMENTS

2011/0040932 A1* 2/2011 Frost .................... G06F 12/0246
711/103
2012/0240012 A1* 9/2012 Weathers ............ G06F 11/1072
714/773

FOREIGN PATENT DOCUMENTS

CN 101546298 A 9/2009
CN 101615427 A 12/2009
(Continued)

OTHER PUBLICATIONS

Office Action of corresponding CN application, dated Apr. 19, 2017.

*Primary Examiner* — Samir W Rizk
(74) *Attorney, Agent, or Firm* — Wang Law Firm, Inc.

(57) ABSTRACT

A data storage device including a flash memory and a controller. The controller performs a first read operation on the pages of a first block of a first block group, and performs a maintenance process to determine whether the first group read count of the first block group is greater than a read threshold when the first read operation is finished. The controller scans the blocks of the first block group to obtain a plurality of first error bit numbers when the first group read count is greater than the read threshold, and updates the block corresponding to the first error bit number that is greater than an error-bit threshold.

13 Claims, 8 Drawing Sheets

(51) Int. Cl.
*G11C 29/52* (2006.01)
*G11C 29/42* (2006.01)
*G11C 29/44* (2006.01)
*G06F 11/10* (2006.01)
*G11C 16/34* (2006.01)
*G06F 3/06* (2006.01)
*G11C 29/04* (2006.01)

(52) U.S. Cl.
CPC ...... *G06F 11/1048* (2013.01); *G11C 16/3418* (2013.01); *G11C 16/3495* (2013.01); *G11C 29/42* (2013.01); *G11C 29/4401* (2013.01); *G11C 29/52* (2013.01); *G06F 2201/81* (2013.01); *G11C 2029/0409* (2013.01); *G11C 2029/0411* (2013.01)

(56) References Cited

FOREIGN PATENT DOCUMENTS

| | | |
|---|---|---|
| CN | 101627444 A | 1/2010 |
| CN | 102272731 A | 12/2011 |
| CN | 103092531 A | 5/2013 |
| CN | 103136108 A | 6/2013 |

* cited by examiner

DATA STORAGE DEVICE AND DATA MAINTENANCE METHOD THEREOF

CROSS REFERENCE TO RELATED APPLICATIONS

This application is a continuation of U.S. application Ser. No. 14/569,442, filed Dec. 12, 2014, which claims priority of Taiwan Patent Application No. 102146529, filed on Dec. 17, 2013, the entirety of which are incorporated by reference herein.

BACKGROUND OF THE INVENTION

Field of the Invention

The present invention relates to a data maintenance method applied to a memory device, and in particular to a data maintenance method capable of error prevention.

Description of the Related Art

Flash memory is considered a non-volatile data storage device, using electrical methods to erase and program itself. Taking NAND Flash as an example, it is often used in memory cards, USB flash devices, solid state devices, eMMC and other uses.

Flash memory, such as NAND FLASH, includes a plurality of blocks. Each of the blocks has a plurality of pages. The stored data may be read out incorrectly from the flash memory. The current solution is encoding the original data which is arranged to be stored into the flash memory and storing the encoded data into the flash memory, such that the encoded data will be read out and decoded to obtain the original data during the read operation. Although the encode/decode process may correct most of the error data, some error data may not be corrected completely by the encode/decode process. When the number of data errors is more than a threshold, the error data is unable to be corrected.

BRIEF SUMMARY OF THE INVENTION

A detailed description is given in the following embodiments with reference to the accompanying drawings.

An exemplary embodiment provides a data storage device. The data storage device includes a flash memory and a controller. The flash memory has a plurality of block groups. Each of the block groups has a plurality of blocks, and each of the blocks has a plurality of pages. The controller is configured to perform a first read operation on at least one first page of a first block of a first block group of the block groups, and perform a maintenance process when the first read operation is finished, wherein the controller is configured to determine whether a first group read count of the first block group is greater than a read threshold in the maintenance process, wherein the controller is configured to scan each of the blocks of the first block group to obtain a plurality of first error bit numbers corresponding to the blocks of the first block group when the first group read count is greater than the read threshold, and update the block corresponding to the first error bit number that is greater than an error-bit threshold.

Another exemplary embodiment provides a data maintenance method applied to a data storage device of a flash memory, wherein the flash memory has a plurality of block groups, each of the block groups has a plurality of blocks, and each block has a plurality of pages. The data maintenance method includes: receiving a first read command; performing a first read operation on at least one first page of a first block of a first block group of the block groups in response to the first read command; and performing a maintenance process when the first read operation is finished. The maintenance process includes: retrieving a first group read count of the first block group; scanning each of the blocks of the first block group to obtain a plurality of first error bit numbers corresponding to the blocks of the first block group when the first group read count is greater than a read threshold; and updating the block corresponding to the first error bit number which is greater than an error-bit threshold.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
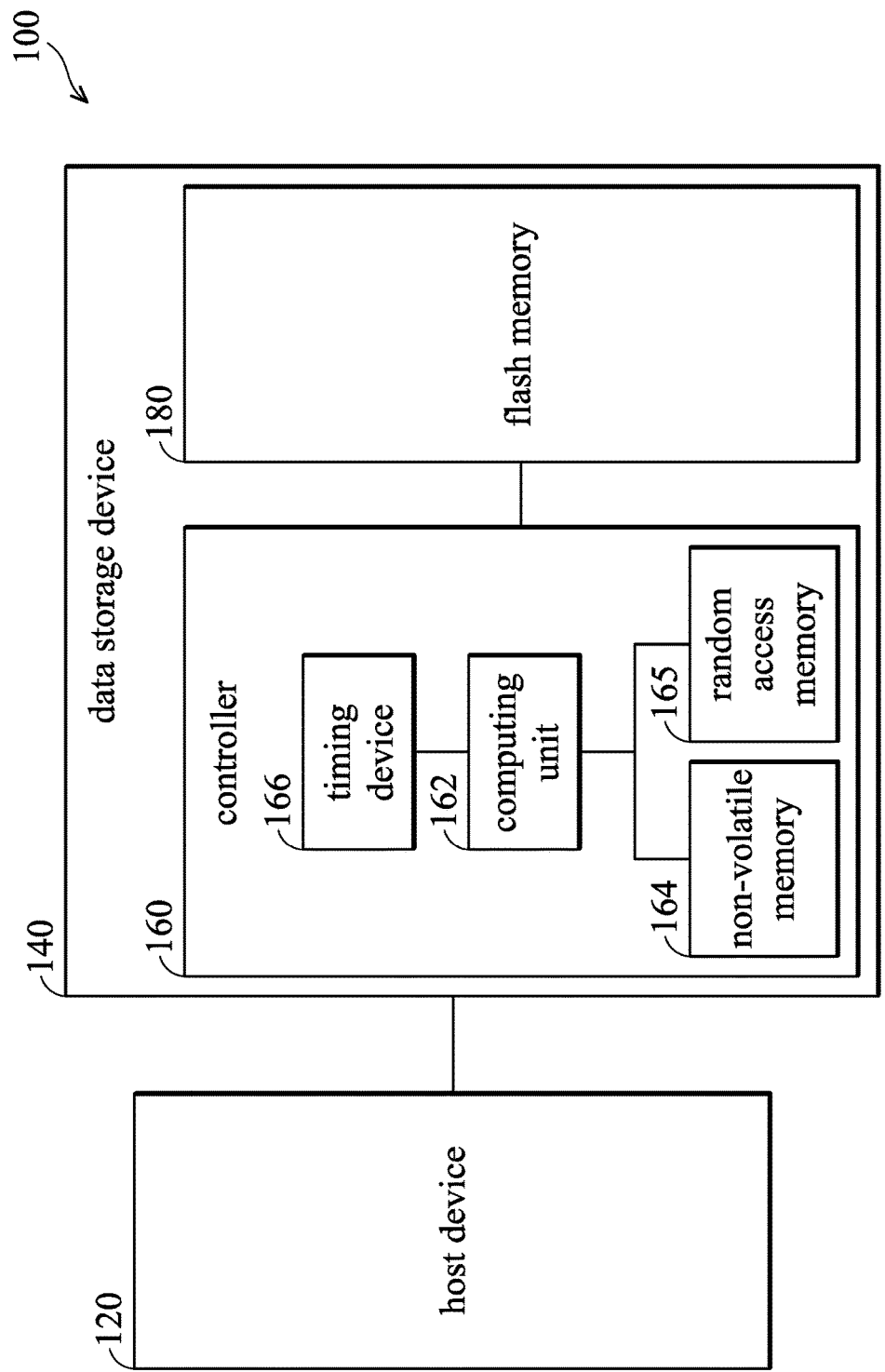
FIG. 1 is a schematic diagram illustrating an embodiment of an electronic system of an exemplary embodiment.

FIG. 1 is a schematic diagram illustrating an embodiment of an electronic system of an exemplary embodiment. The electronic system 100 includes a host device 120 and a data storage device 140. The data storage device 140 includes a controller 160 and a flash memory 180. Furthermore, the data storage device 140 may operate in response to the commands received from the host device 120. The controller 160 includes a computing unit 162, a non-volatile memory 164 (such as read only memory), a random access memory 165 and a timing device 166. The program code and data stored in the nonvolatile memory 164 may constitute firmware, and be performed by the computing unit 162, such that the controller 160 may control the flash memory 180 by the firmware. For example, the controller 160 may perform a read operation according to a read command and perform a maintenance process after the read operation. It should be noted that, in one embodiment, the maintenance process is executed in the background, but it is not limited thereto. For example, the controller 160 only performs the maintenance procedure when it is idle, and discontinues the maintenance procedure when receiving commands from the host device 120 until the operation corresponding to the received command has finished. The flash memory 180 has a plurality of blocks, and each of the blocks has a plurality of pages. The timing device 166 is arranged to record the life time of the data storage device 180, wherein the life time is the time that the data storage device 180 was powered on. Moreover, the data storage device 180 is further arranged to store at least one parameter table arranged to record the group read counts of the block groups, the total read count and the life time.

Figure 2:
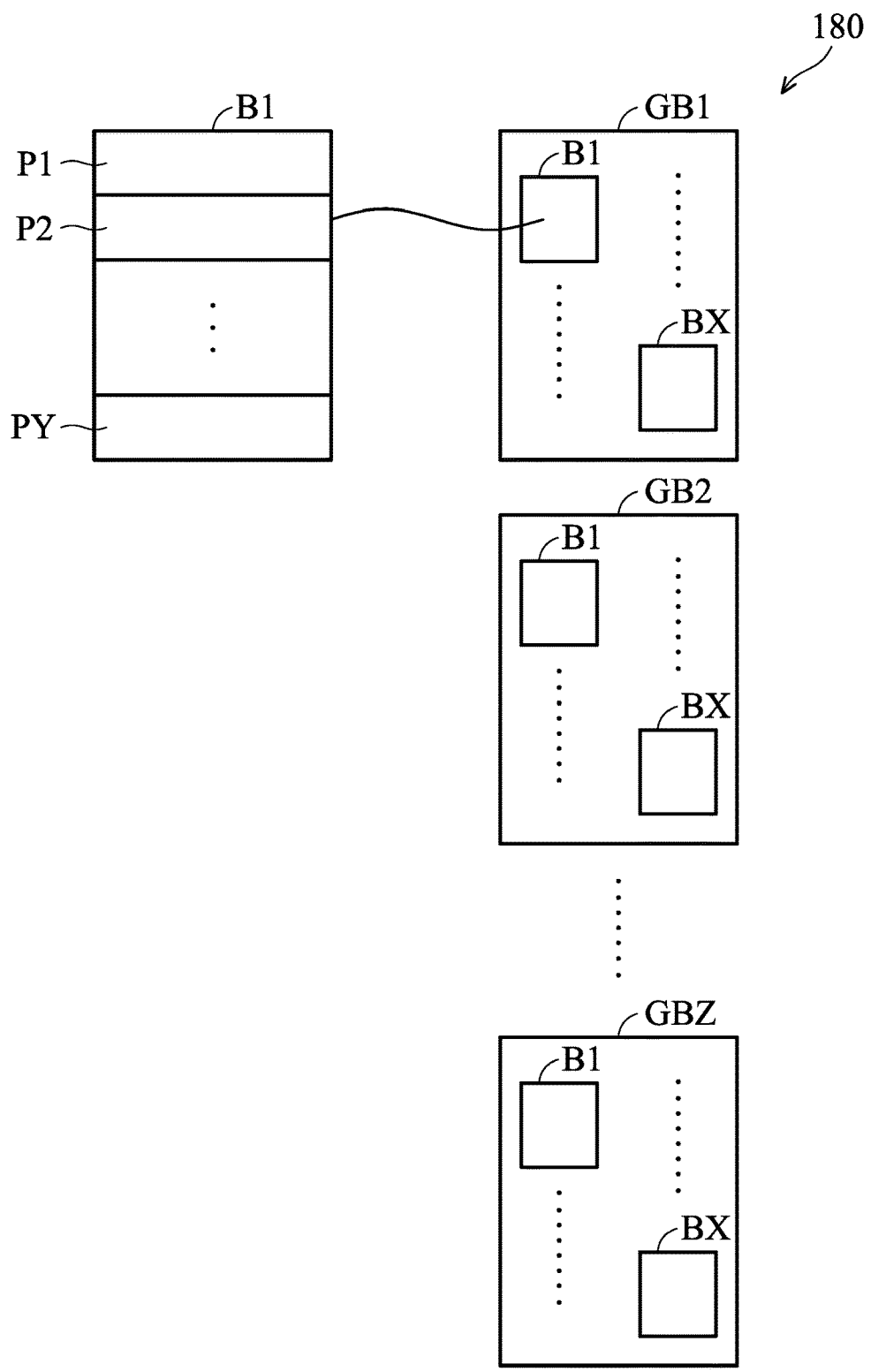
FIG. 2 is a schematic diagram illustrating an embodiment of a flash memory of an exemplary embodiment.

FIG. 2 is a schematic diagram illustrating an embodiment of a flash memory of an exemplary embodiment. The flash memory 180 includes Z*X blocks, and each of the blocks has Y pages P1~PY. In one embodiment, the Z*X blocks of the flash memory 180 can be divided into Z block groups GB1~GBZ. Namely, each of the block groups GB1~GBZ has X blocks B1~BX. In one embodiment of the present invention, the flash memory 180 is divided into 64 block groups, but it is not limited thereto. It should be noted that X, Y and Z can be any positive integer that is greater than two.

Figure 3:
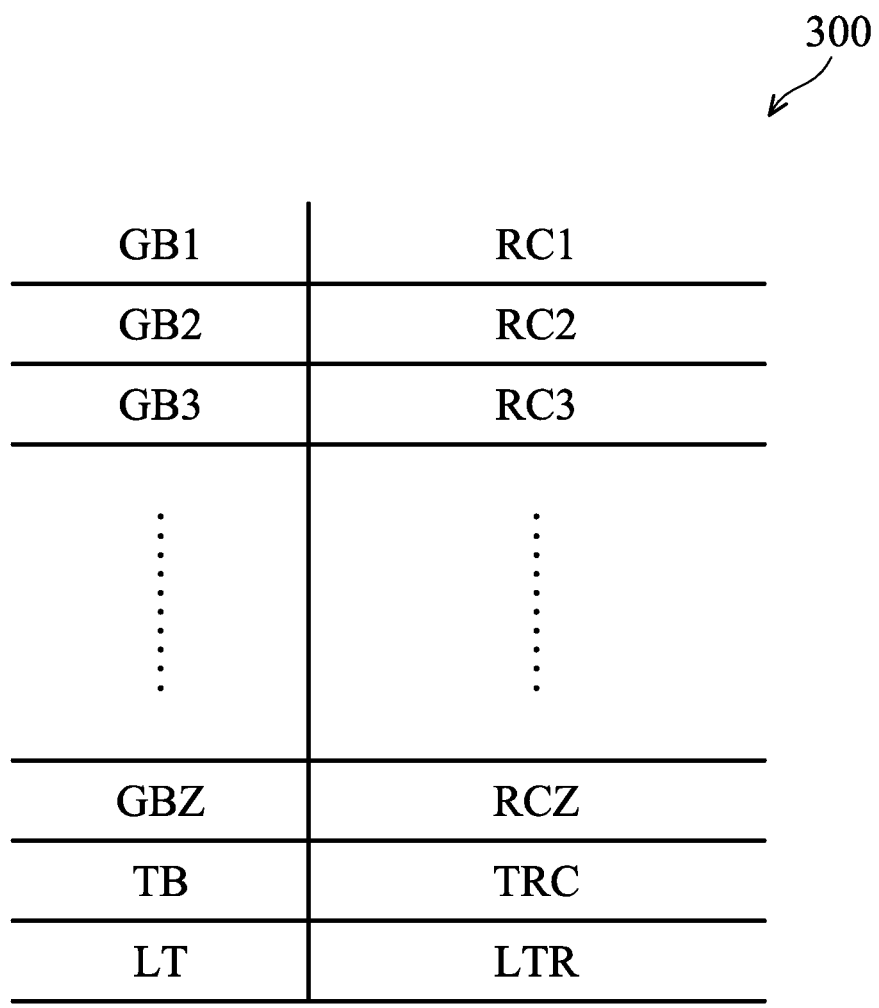
FIG. 3 is a schematic diagram illustrating an embodiment of a parameter table of an exemplary embodiment.

FIG. 3 is a schematic diagram illustrating an embodiment of a parameter table of an exemplary embodiment. In this embodiment, the parameter table 300 records the group read counts RC1~RCZ of the block groups GB1~GBZ, a total read count TRC, and a life time LTR, wherein the index of the life time LTR is LT, the index of the total read count TRC is TB, and the indexes of the group read counts RC1~RCZ are GB1~GBZ, but it is not limited thereto. In other embodiments, the group read counts RC1~RCZ, the total read count TRC and the life time LTR can be another analog or digital code. It should be noted that the group read counts RC1~RCZ are the number of times that the pages of the corresponding block groups GB1~GBZ have been read. For example, the group read count RC1 of the block group GB1 is arranged to indicate the sum of the pages P1~PY of the block group GB1 have been read. The group read count RC2 of the block group GB2 is arranged to indicate the sum of the pages P1~PY of the block group GB2 have been read. The group read count RCZ of the block group GBZ is arranged to indicate the sum of the pages P1~PY of the block group GBZ have been read, and so forth. The total read count TRC is arranged to indicate the number of times that all of the pages of the data storage device 140 have been read. Moreover, the life time LTR is arranged to indicate the time that the flash memory 180 was powered on, but it is not limited thereto. The group read counts RC1~RCZ, the total read count TRC and the life time LTR may be stored in different parameter tables or a different memory device. Moreover, when the controller 160 performs the maintenance process, the controller 160 loads the parameter table 300 stored in the flash memory 180 into the random access memory 165, and updates the parameter table 300 of the flash memory 180 by the parameter table 300 loaded in the random access memory 165 at a predetermined time interval, but it is not limited thereto. The controller 160 may also update the parameter table 300 of the flash memory 180 by the parameter table 300 loaded in the random access memory 165 when any parameters of the parameter table 300 is changed. It should be noted that, in the maintenance process, the group read counts RC1~RCZ and the total read count TRC will not be increased. Namely, the read operation on the pages in the maintenance process does not affect the group read counts RC1~RCZ and the total read count TRC, but it is not limited thereto.

In one embodiment, the controller 160 performs a first read operation on at least one first page in response to a first read command, and increase the group read count of the first block group which includes the first page by a first predetermined value, wherein the first predetermined value is the number of first pages in the first block group that have been read, but it is not limited thereto. It should be noted that the first read command can read the pages included in more than one block group. Namely, there may be more than one first block group. Next, the controller 160 performs a maintenance process after the first read operation is finished. In the maintenance process, the controller 160 determines that whether the group read count of the first block group is greater than a read threshold, such as 500 times, but it is not limited thereto. Namely, the controller 160 is configured to determine whether the number of times that all of the pages of the first block group have been read is greater than a predetermined value (read threshold). When the group read count is greater than the read threshold, the controller 160 scans the blocks B1~BX of the first block group which is greater than the read threshold to obtain the error bit numbers of the blocks B1~BX. More specifically, the controller 160 reads the blocks B1~BX of the first block group which is greater than the read threshold, and obtains the error bit numbers of the error correction (ECC) during the process of reading the blocks B1~BX. Next, the controller 160 is further configured to update (Read Refresh or Read Retirement) the block having the error bit number which is greater than the error-bit threshold. It should be noted that the error-bit threshold is the maximum of the error bits that the error correction can correct. For example, the data can be corrected by the Error Correction (ECC) when the error bit is less than 43 bits, and the threshold of the error bit value may be 35 bit or 38 bit, but it is not limited thereto. Persons with skill in the art may determine the predetermined threshold of the error bit value according to the maximum of the error bit value that can be corrected by the Error Correction (ECC). Therefore, the controller 160 may remove the data to another block by the maintenance process before the data cannot be corrected by the error correction. It should be noted that, in the maintenance process, the controller 160 is further configured to decrease the group read count which is greater than the read threshold of the first block group by a second predetermined value or reset the group read count which is greater than the read threshold of the first block group to zero. For example, when any error bit number of the block of the first block group is greater than the error-bit threshold, the controller 160 decrease the group read count of the first block group by a second predetermined value after updating the block having the error bit number which is greater than the error-bit threshold. When none of the error bit numbers of the blocks of the first block group is greater than the error-bit threshold, the controller 160 decreases the group read count of the first block group by the second predetermined value after determining that none of the error bit numbers of the blocks of the first block group is greater than the error-bit threshold. The second predetermined value is the group read count of the first block group, but it is not limited thereto. In another embodiment, the controller 160 is configured to reset the group read count that is greater than the read threshold of the first block group to zero once determining that the group read count of the first block group is greater than the read threshold.

For example, the controller 160 performs a first read operation on the pages P1~P4 of the block B1 of the block group GB1 in response to a first read command. The controller 160 increases the group read count RC1 of the block group GB1 by 4. Next, the controller 160 performs the maintenance process after the first read operation is finished (the first pages P1~P4 are all read). In the maintenance process, the controller 160 determines whether the group read count RC1 of the block group GB1 is greater than a read threshold. Namely, the controller 160 is configured to determine whether the number of times that all of the pages of the block group GB1 have been read is greater than a predetermined value (read threshold). When the group read count RC1 is greater than the read threshold, the controller 160 scans the blocks B1~BX of the block group GB1 to obtain the error bit numbers of each of the blocks B1~BX of the block group GB1. When any error bit numbers of the blocks B1~BX is greater than the error-bit threshold, the controller 160 updates (Read Refresh or Read Retirement) the block having an error bit number which is greater than the error-bit threshold. For example, when the error bit numbers of the block B1~B4 are greater than the error-bit threshold, the controller 160 updates the blocks B1~B4. It should be noted that, in the maintenance process, the controller 160 is further arranged to decrease the group read count RC1 of the block group GB1 by a second predetermined value or reset the group read count RC1 of the block group GB1 to zero. For example, when any error bit numbers of the blocks B1~B4 of the block group GB1 are greater than the error-bit threshold, the controller 160 is configured to decrease the group read count RC1 of the block group GB1 by the second predetermined value after updating the block B1~B4. When none of the error bit numbers of the blocks B1~BX of the block group GB1 is greater than the error-bit threshold, the controller 160 decreases the group read count RC1 of the block group GB1 by the second predetermined value after determining that none of the error bit numbers of the blocks of the first block group is greater than the error-bit threshold. The second predetermined value is the group read count RC1 of the block group GB1, but it is not limited thereto. It should be noted that, in another embodiment, the controller 160 is configured to reset the group read count RC1 that is greater than the read threshold of the block group GB1 to zero once determining that the group read count RC1 of the block group GB1 is greater than the read threshold.

For another example, the controller 160 perform a first read operation on the pages P1~PY of the block BX of the block group GB1, the pages P1~PY of the block B1 of the block group GB2 and the pages P1~P6 of the block B2 of the block group GB2. The controller 160 increase the group read count RC1 of the block group GB1 by Y, and increase the group read count RC2 of the block group GB2 by (Y+6). Next, the controller 160 performs a maintenance process after the first read operation is finished. In the maintenance process, the controller 160 determines whether the group read count RC1 of the block group GB1 and the group read count RC2 of the block group GB2 are greater than a read threshold. Namely, the controller 160 determines whether the number of times that the pages of the block group GB1 have been read is greater than the read threshold and whether the number of times that the pages of the block group GB2 have been read is greater than the read threshold. For example, when the group read count RC1 of the block group GB1 is not greater than the read threshold and the group read count RC2 of the block group GB2 is greater than the read threshold, the controller 160 only needs to scan the blocks B1~BX of the block group GB2 to obtain the error bit numbers of each blocks B1~BX of the block group GB2. When both the group read count RC1 of the block group GB1 and the group read count RC2 of the block group GB2 are greater than the read threshold, the controller 160 scans the blocks B1~BX of the block group GB1 and the block group GB2 to obtain the error bit numbers of each blocks B1~BX of the block group GB1 and the block group GB2. When any of the error bit numbers of the blocks B1~BX is greater than an error-bit threshold, the controller 160 is further configured to update (Read Refresh or Read Retirement) the block corresponding to the error bit number which is greater than the error-bit threshold. It should be noted that, in the maintenance process, the controller 160 is further configured to decrease the group read count RC1 and/or the group read count RC2 which is greater than the read threshold by a second predetermined value or reset the group read count RC1 and/or the group read count RC2 which is greater than the read threshold to zero. For example, when the group read count RC1 of the block group GB1 is not greater than the read threshold and the group read count RC2 of the block group GB2 is greater than the read threshold, the controller 160 decrease the group read count RC2 which is greater than the read threshold by the second predetermined value or reset the group read count RC2 which is greater than the read threshold to zero, such that the group read count RC1 of the block group GB1 will not be changed. In one embodiment, when the error bit numbers of the blocks B1~BX of the block group GB2 are greater than the error-bit threshold, the controller 160 decreases the group read count RC2 of the block group GB2 by the second predetermined value after updating the blocks B1~B4. When none of the error bit numbers of the blocks B1~BX of the block group GB2 is greater than the error-bit threshold, the controller 160 decreases the group read count RC2 of the block group GB2 by the second predetermined value after determining that none of the error bit numbers of the blocks B1~BX of the block group GB2 is greater than the error-bit threshold, wherein the second predetermined value is the group read count RC2, but it is not limited thereto. It should be noted that, in another embodiment, the controller 160 is configured to reset the group read count RC2 of the block group GB2 to zero when determining that the group read count RC2 of the block group GB2 is greater than the read threshold.

In another embodiment, the controller 160 is configured to perform a first read operation on at least one first page in response to a first read command, and increase the total read count TRC by the first predetermined value, wherein the first predetermined value is the number of first page(s) read by the first read operation. It should be noted that the first read command is arranged to read the pages included in more than one block or pages included in more than one block group, but it is not limited thereto. Next, the controller 160 performs a maintenance process after the first read operation is finished. In the maintenance process, the controller 160 is configured to determine whether the total read count TRC is greater than a total read threshold. For example, the total read threshold can be 2000 times, but it is not limited thereto. Namely, the controller 160 is configured to determine whether the number of times that all of the pages of the flash memory 180 have been read is greater than the total read threshold. When the total read count TRC is greater than the total read threshold, the controller 160 scans all of the blocks B1~BX of the block groups GB1~GBZ of the flash memory 180 to obtain the error bit numbers of each block B1~BX of the block groups GB1~GBZ. More specifically, the controller 160 is configured to read all of the blocks B1~BX of the block groups GB1~GBZ and obtain the error bit numbers of the error correction (ECC) during the process of reading the blocks B1~BX of the block groups GB1~GBZ. When any of the error bit numbers of the blocks B1~BX of the block groups GB1~GBZ is greater than the error-bit threshold, the controller 160 updates (Read Refresh or Read Retirement) the block corresponding to the error bit number which is greater than the error-bit threshold. It should be noted that, in the maintenance process, the controller 160 is further configured to decrease the total read count TRC by a second predetermined value or reset the total read count TRC to zero. In one embodiment, when any error bit number of the block of a block group is greater than the error-bit threshold, the controller 160 decreases the total read count TRC by the second predetermined value after updating the block(s) having the error bit number greater than the error-bit threshold. When none of the error bit numbers of the blocks B1~BX of the block groups GB1~GBZ is greater than the error-bit threshold, the controller 160 is configured to decrease the total read count TRC by the second predetermined value after determining that none of the error bit numbers of the blocks B1~BX of the block groups GB1~GBZ is greater than the error-bit threshold, wherein the second predetermined value is the total read count TRC, but it is not limited thereto. It should be noted that, in another embodiment, the controller 160 is configured to reset the total read count TRC to zero after determining whether the total read count TRC is greater than the total read threshold.

In another embodiment, the controller 160 is configured to perform a first read operation on at least one first page in response to a first read command. Next, the controller 160 performs a maintenance process after the first read operation is finished. In the maintenance process, the controller 160 determines whether the life time LTR is over a time threshold. For example, the time threshold may be 7 days, but it is not limited thereto. Namely, the controller 160 determines whether the time that the data storage device 140 was powered on is over the time threshold. When the life time LTR is over the time threshold, the controller 160 scans all of the blocks B1~BX of the block groups GB1~GBZ of the flash memory 180 to obtain the error bit numbers of the blocks B1~BX of the block groups GB1~GBZ. More specifically, the controller 160 reads all of the blocks B1~BX of the block groups GB1~GBZ in sequence. The controller 160 obtains the error bit numbers of the blocks B1~BX of the error correction (ECC) during the process of reading the blocks B1~BX of the block groups GB1~GBZ. When any of the error bit numbers of the blocks B1~BX of the block groups GB1~GBZ is greater than an error-bit threshold, the controller 160 updates (Read Refresh or Read Retirement) the blocks corresponding to the error bit number which is greater than the error-bit threshold. It should be noted that, in the maintenance process, the controller 160 is further arranged to decrease the life time LTR by a second predetermined value or reset the life time LTR to zero. In one embodiment, the controller 160 is configured to decrease the life time LTR by a second predetermined value after updating the block(s) having error bit number(s) which are greater than the error-bit threshold. When none of the error bit numbers of the blocks B1~BX of the block groups GB1~GBZ is greater than the error-bit threshold, the controller 160 is configured to decrease the life time LTR by a second predetermined value after determining that none of the error bit numbers of the blocks B1~BX of the block groups GB1~GBZ is greater than the error-bit threshold, wherein the second predetermined value is the life time LTR, but it is not limited thereto. It should be noted that, in another embodiment, the controller 160 resets the life time LTR to zero after determining whether the life time LTR is greater than the time threshold.

In one embodiment, when the controller 160 receives an operation command during the maintenance process, the controller 160 records the current data of the maintenance process into the random access memory 165, and discontinues the maintenance process. Next, the controller 160 performs the operation in response to the operation command. The controller 160 is configured to continue the maintenance process according to the current data of the maintenance process stored in the random access memory 165 after the operation is finished. For example, when the operation command is a second read command, the controller 160 discontinues the maintenance process, performs a second read operation on at least one page in response to the second read command, and increases the group read count of the block group which includes the pages read by the second read command and/or the total read count TRC by a third predetermined value, wherein the third predetermined value is the number of pages read by the second read operation.

For example, in the maintenance process, the controller 160 scans the blocks of the block group GB1 which has the group read count RC1 greater than the read threshold. The controller 160 receives a second read command from the host device 120 during the process of scanning the page P2 of the block B6 of the block group GB1. The controller 160 stores the current data of the maintenance process into the random access memory 165 after receiving the second read command, wherein the current data of the maintenance process includes the data that indicates the page P2 of the block B6 of the block group GB1 and the current group read count RC1, but it is not limited thereto. Next, the controller 160 performs the second read operation in response to the second read command. It should be noted that, when the second read operation is arranged to read pages P1~P7 of the block B1 of the block group GB1, the controller 160 increase the group read count RC1 of the parameter table 200 by 7. The controller 160 continues to perform the maintenance process in response to the current data of the maintenance process which is stored in the random access memory 165 after the second read operation is finished. It should be noted that, when any error bit number of the block of the block group GB1 is greater than the error-bit threshold, the controller 160 is configured to update the block corresponding to the error bit number which is greater than the error-bit threshold and decrease the group read count RC1 which has been increased in the parameter table 200 by the original group read count RC1. Namely, the number of pages that have been read before the maintenance process is subtracted from the group read count RC1 and the read number of the second read operation after the block is updated by the controller 160 is kept. In another embodiment, after the blocks are updated by the controller 160, the total read count TRC is also decreased by the number that all pages have been read before the maintenance process and keeps the read number of the second read operation. Similarly, the life time LTR is also decreased by the time from powering on to the maintenance process and the time increased during the second read operation is kept after the block is updated.

In another embodiment, in the maintenance process, the controller 160 is configured to reset the group read count RC1 to zero after the step of determining whether the group read count RC1 is greater than the read threshold. The controller 160 receives a second read command from the host device 120 when the scan process goes to the page P2 of the block B6 of the block group GB1. The controller 160 stores the current data of the maintenance process in the random access memory 165 after receiving the second read command, wherein the current data of the maintenance process includes the data which indicates the P2 of the block B6 of the block group GB1, but it is not limited thereto. Next, the controller 160 preforms the second read operation in response to the second read command. It should be noted that, when the second read operation is arranged to read the pages P1~P7 of the block B1 of the block group GB1, the controller 160 increases the group read count RC1 which has been reset to zero and stored in the parameter table 200 by 7. After the second read operation is finished, the controller 160 continues the maintenance process according to the current data of the maintenance process stored in the random access memory 165. Namely, the group read count RC1 is decreased by the number of times that the pages have been read during the maintenance process and the number of the times that pages have been read by the second read operation is kept in the group read count RC1 after the maintenance process is finished. In another embodiment, after the maintenance process is finished, the total read count TRC is also decreased by the number of times that the pages have been read before the maintenance process, and the number of times that the pages have been read by the second read operation is kept in the total read count TRC. Similarly, the life time LTR is decreased by the number of times that the pages have been read before the maintenance process and the number of times that the pages have been read by the second read operation is kept in the life time LTR after the maintenance process is finished.

Figure 4:
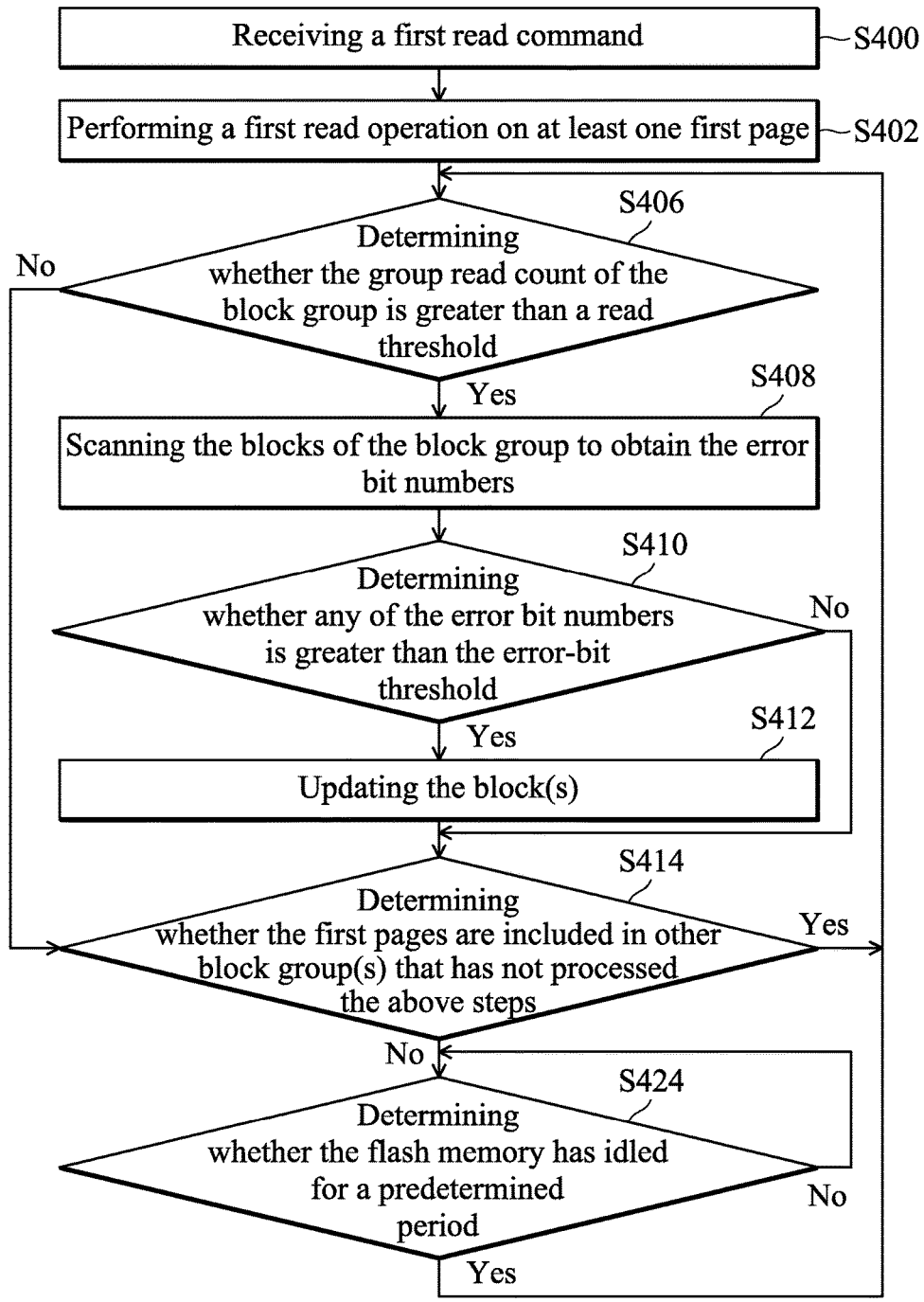
FIG. 4 is a flowchart of a data maintenance method according to an exemplary embodiment.

FIG. 4 is a flowchart of a data maintenance method according to an exemplary embodiment. The data maintenance method is applied to the data storage device 140 of FIG. 1. The process starts at step S400.

In step S400, the controller 160 receives a first read command from the host device 120.

Next, in step S402, the controller 160 performs a first read operation on at least one first page in response to the received first read command, and increase the group read count of the first block group which includes the first page by a first predetermined value, wherein the first predetermined value is the number of the first pages in the first block group that have been read, but it is not limited thereto. It should be noted that the first read command can read the pages included in more than one block or more than one block group. For example, the controller 160 perform a first read operation on the pages P1~P4 of the block B1 of the block group GB1 in response to a first read command. The controller 160 increases the group read count RC1 of the block group GB1 by 4 and stores the increased group read count RC1 in the parameter table 200. In another example, the controller 160 perform a first read operation on the pages P1~PY of the block BX of the block group GB1, the pages P1~PY of the block B1 of the block group GB2 and the pages P1~P6 of the block B2 of the block group GB2 in response to the first read command and stores the increased group read counts in the parameter table 200.

Next, the controller 160 performs the maintenance process after the first read operation is finished. First, in step S406, the controller 160 retrieves the group read count of the first block group from the parameter table 200 and determines whether the group read count of the first block group is greater than a read threshold. Namely, the controller 160 is configured to determine whether the number of times that all of the pages of the first block group have been read is greater than a predetermined value (read threshold) When the group read count is greater than the read threshold, the process goes to step S408, otherwise, the process goes to step S414. For example, when the first block group including the first page is the block group GB1, the controller 160 retrieves the group read count RC1 of the block group GB1 from the parameter table 200 and determines whether the group read count RC1 of the block group GB1 is greater than a read threshold. Namely, the controller 160 is configured to determine whether the number of times that all of the pages of the block group GB1 have been read is greater than a predetermined value (read threshold). In another embodiment, when the first block group including the first page is the block groups GB1~GB2, the controller 160 retrieves the group read count RC1 of the block group GB1 form the parameter table 200 and determines whether the group read count RC1 is greater than the read threshold. Namely, the controller 160 is configured to determine whether the number of times that all of the pages of the block group GB1 have been read is greater than a predetermined value (read threshold).

In step S408, the controller 160 scans the blocks B1~BX of the first block group to obtain the error bit numbers of each of the blocks B1~BX of the first block group. More specifically, the controller 160 read the blocks B1~BX of the first block group which is greater than the read threshold, and obtain the error bit numbers of the error correction (ECC) during the process of reading the blocks B1~BX. For example, when the group read count RC1 is greater than the read threshold, the controller 160 scans the blocks B1~BX of the block group GB1 to obtain the error bit numbers of the blocks B1~BX of the block group GB1.

Next, in step S410, controller 160 is configured to determine whether any of the error bit numbers obtained in step S408 is greater than the error-bit threshold. When any of the error bit numbers is greater than the error-bit threshold, the process goes to step S412, otherwise, the process goes to step S414. It should be noted that the error-bit threshold is the maximum of the error bits that the error correction can correct. For example, the data can be corrected by the Error Correction (ECC) when the error bit is less than 43 bits, and the threshold of the error bit value may be 35 bit or 38 bit, but it is not limited thereto. Persons with skill in the art may determine the predetermined threshold of the error bit value according to the maximum of the error bit value that can be corrected by the Error Correction (ECC).

In step S412, the controller 160 is configured to update (Read Refresh or Read Retirement) the block corresponding to the error bit number which is greater than the error-bit threshold. For example, when the error bit numbers of the block B1~B4 are greater than the error-bit threshold, the controller 160 updates the blocks B1~B4.

Next, in step S414, the controller 160 determines whether the first pages are included in other block group(s). When any of the first pages is included in other block group(s), the process goes to step S406 to process the block group(s) in sequence, otherwise, the process goes to step S424. For example, the first read command is arranged to enable the controller 160 to perform the first read operation on the pages of the block group GB1 and the block group GB2, wherein the controller 160 has performed the maintenance process on the block group GB1, but before the maintenance process is performed on the block group GB2. Therefore, the process returns to step S406, the controller 160 continues to retrieve the group read count RC2 of the block group GB2 from the parameter table 200 and determine whether the read threshold is greater than the group read count RC2 of the block group GB2.

In step S424, the controller 160 determines whether the flash memory 140 has idled for a predetermined period. When the flash memory 140 idles for the predetermined period, the process returns to step S406, otherwise, the controller 160 continues to determine whether the flash memory 140 has idled for the predetermined period. It should be noted that, in the maintenance process (steps S406~S424), the controller 160 is further configured to decrease the group read count which is greater than the read threshold of the first block group by a second predetermined value or reset the group read count which is greater than the read threshold of the first block group to zero. For example, when any error bit number of the block of the first block group is greater than the error-bit threshold, the controller 160 decreases the group read count of the first block group by a second predetermined value after the block(s) is updated by step S412. When none of the error bit numbers of the blocks of the first block group is greater than the error-bit threshold, the controller 160 decreases the group read count of the first block group by the second predetermined value after determining that none of the error bit numbers of the blocks of the first block group is greater than the error-bit threshold in step S410, wherein the second predetermined value is the group read count of the first block group obtained by step S402, but it is not limited thereto. In another embodiment, the controller 160 is configured to reset the group read count that is greater than the read threshold of the first block group to zero after the step (step S406) of determining whether the group read count of the first block group is greater than the read threshold. Moreover, in one embodiment, when the controller 160 receives an operation command in the maintenance process (steps S406~S424), the controller 160 is further configured to record the current data of the maintenance process in the random access memory 165 and discontinue the maintenance process. Next, the controller 160 performs the operation in response to the operation command. After the operation is finished, the controller 160 continues the maintenance process according to the current data of the maintenance process stored in the random access memory 165. For example, when the operation command is a second read command, the controller 160 discontinues the maintenance process, performs a second read operation on at least one page in response to the second read command, and increase the group read count of the block group which includes the pages read by the second read command and/or the total read count TRC by a third predetermined value, wherein the third predetermined value is the number of pages read by the second read operation.

Figure 5:
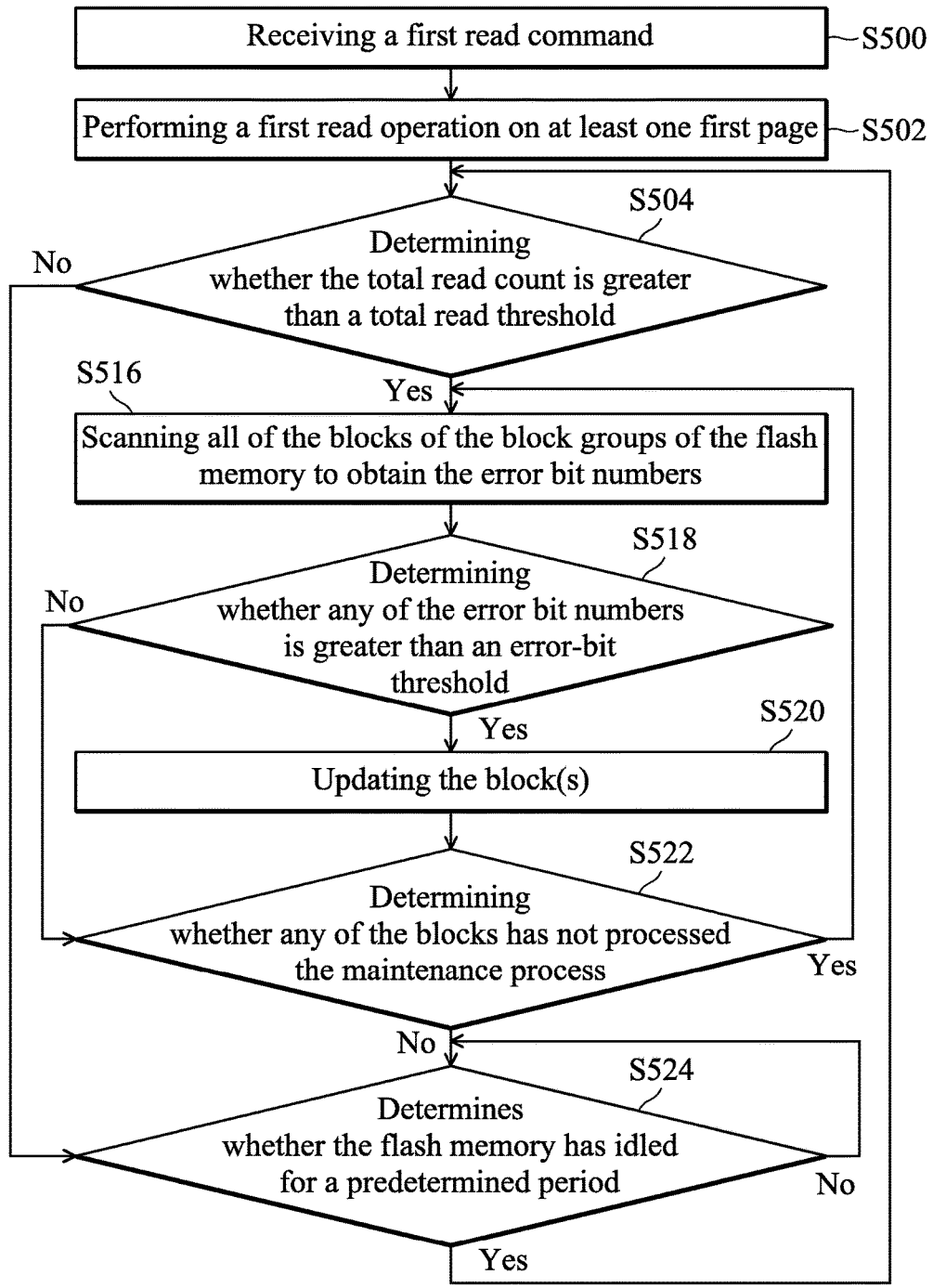
FIG. 5 is a flowchart of a data maintenance method according to exemplary embodiments.

FIG. 5 is a flowchart of a data maintenance method according to exemplary embodiments. The data maintenance method is applied to the data storage device 140 of FIG. 1. The process starts at step S500.

In step S500, the controller 160 receives a first read command from the host device 120.

Next, in step S502, the controller 160 is configured to perform a first read operation on at least one first page in response to a first read command, and increase the total read count TRC by the first predetermined value, wherein the first predetermined value is the number of first pages read by the first read operation. It should be noted that the first read command is arranged to read the pages included in more than one block or pages included in more than one block group, but it is not limited thereto. For example, the controller 160 performs a first read operation on the pages P1~P4 of the block B1 of the block group GB1 in response to the first read command, and increases the total read count TRC by 4. In another embodiment, the controller 160 performs a first read operation on the pages P1~PY of the block BX of the block group GB1, the pages P1~PY of the block B1 of the block group GB2 and the pages P1~P6 of the block B2 of the block group GB2 in response to the first read command. Furthermore, the controller 160 increases the total read count TRC by (Y+Y+6), and stores the increased total read count TRC in the parameter table 200.

Next, the controller 160 performs the maintenance process after the first read operation is finished. First, in step S504, the controller 160 retrieves the total read count TRC from the parameter table 200 and determines whether the total read count TRC is greater than a total read threshold. Namely, the controller 160 determines whether the number of times that all of the pages of the flash memory 180 have been read is greater than a predetermined value (total read count TRC). When the total read count TRC is greater than the total read threshold, the process goes to step S516, otherwise, the process goes to step S524.

In step S516, the controller 160 scans all of the blocks B1~BX of the block groups GB1~GBZ of the flash memory 180 to obtain the error bit numbers of each of the blocks B1~BX of the block groups GB1~GBZ. For example, the controller 160 scans the block B1 of the block group GB1 at first, and the process goes to steps S518~S520. In step S522, the controller 160 determines that the blocks B2~BX of the block group GB1 have not performed the maintenance process. Therefore, the process returns to step S516. The controller 160 continues to scan the block B2 of the block group GB1, and so on, until all of the blocks of the flash memory 180 are processed by the maintenance process.

In step S518, the controller 160 is configured to determine whether any of the error bit numbers of the blocks B1~BX of the block groups GB1~GBZ is greater than an error-bit threshold. When the error bit numbers is greater than the error-bit threshold, the process goes to step S520, otherwise, the process goes to step S522.

In step S520, the controller 160 is further configured to update (Read Refresh or Read Retirement) the block corresponding to the error bit number which is greater than the error-bit threshold.

Next, in step S522, the controller 160 determines whether any of the blocks B1~BX of the block groups GB2~GBZ and the block B2~BX of the block group GB1 has not processed the maintenance process. When any of the blocks has not processed the maintenance process, the process returns to step S516, and the controller 160 continues to scan the blocks of the flash memory 180 to obtain the error bit numbers of the blocks, otherwise, the process goes to step S524.

In step S524, the controller 160 determines whether the flash memory 140 has idled for a predetermined period. When the flash memory 140 idles for the predetermined period, the process returns to S504, otherwise, the controller 160 continues to determine whether the flash memory 140 has idled for the predetermined period. It should be noted that, in the maintenance process (steps S504~S524), the controller 160 is further configured to decrease the total read count TRC by a second predetermined value or reset the total read count TRC to zero. For example, when any error bit numbers of the blocks is greater than an error-bit threshold, the controller 160 is further configured to decrease the total read count TRC by the second predetermined value after the blocks having the error bit number which is greater than the error-bit threshold are updated in step S520. When none of the error bit numbers of the blocks B1~BX of the block groups GB1~GBZ is greater than the error-bit threshold, the controller 160 is configured to decrease the total read count TRC by the second predetermined value after determining that none of the error bit numbers of the blocks B1~BX of the block groups GB1~GBZ is greater than the error-bit threshold (step S518), wherein the second predetermined value is the total read count TRC, but it is not limited thereto. It should be noted that, in another embodiment, the controller 160 is configured to reset the total read count TRC to zero after determining whether the total read count TRC is greater than the total read threshold (step S504). Moreover, in another embodiment, when the controller 160 receives an operation command in the maintenance process (steps S504~S524), the controller 160 is further configured to record the current data of the maintenance process in the random access memory 165 and discontinue the maintenance process. Next, the controller 160 performs the operation in response to the operation command. After the operation is finished, the controller 160 continues the maintenance process according to the current data of the maintenance process stored in the random access memory 165. For example, when the operation command is a second read command, the controller 160 discontinues the maintenance process, performs a second read operation on at least one page in response to the second read command, and increase the total read count TRC by a third predetermined value, wherein the third predetermined value is the number of pages read by the second read operation.

Figure 6:
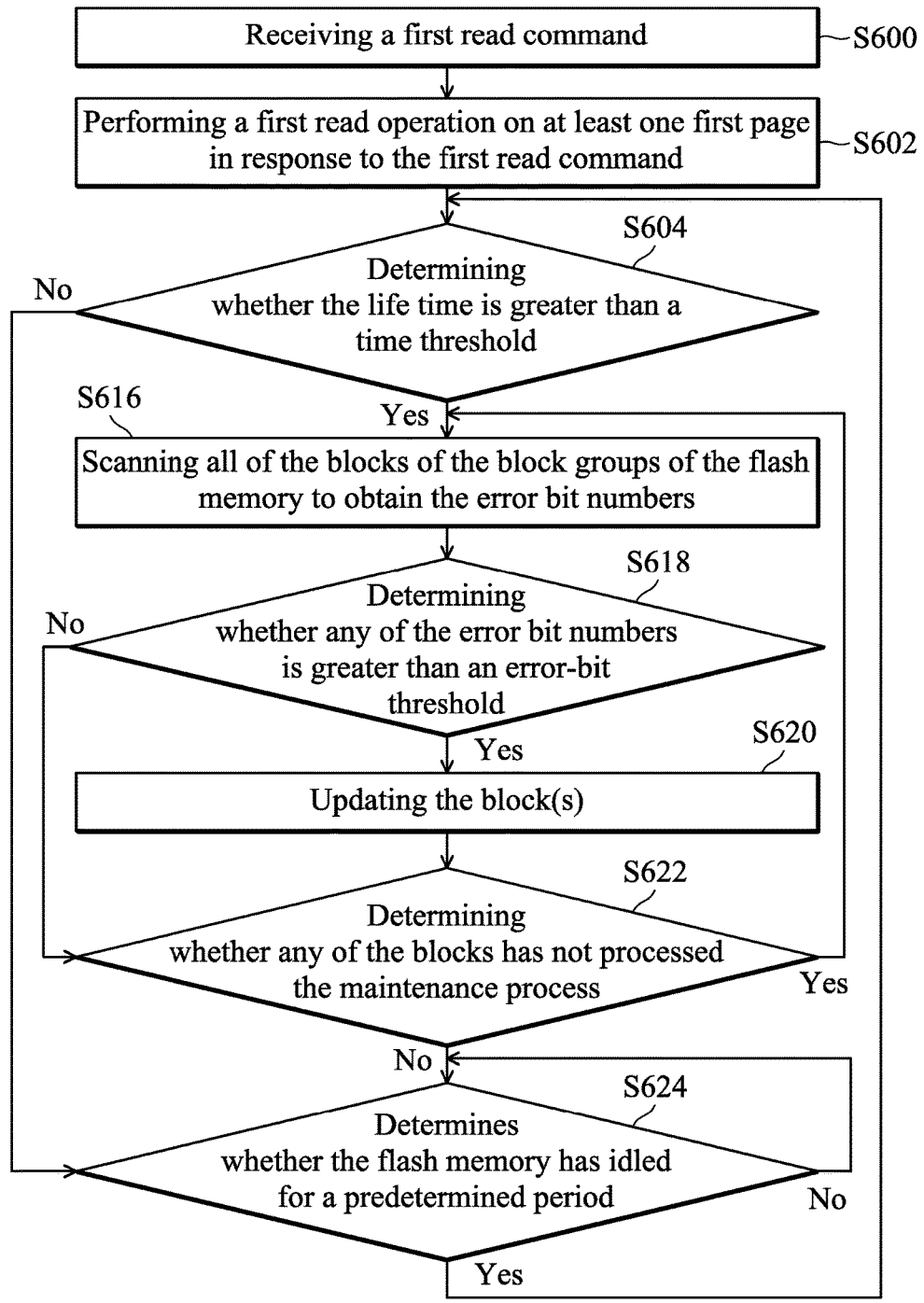
FIG. 6 is a flowchart of a data maintenance method according to exemplary embodiments.

FIG. 6 is a flowchart of a data maintenance method according to exemplary embodiments. The data maintenance method is applied to the data storage device 140 of FIG. 1. It should be noted that, in this embodiment, the timing device 166 of the data storage device 140 is arranged to record the time that the flash memory 140 was powered on. The process starts at step S600.

In step S600, the controller 160 receives a first read command from the host device 120.

Next, in step S602, the controller 160 performs a first read operation on at least one first page in response to the received first read command. It should be noted that the first read command can read the pages included in more than one block or more than one block groups.

Next, the controller 160 performs the maintenance process after the first read operation is finished. First, in step S604, the controller 160 retrieves the life time LTR from the parameter table 200 and determines whether the life time LTR is greater than a time threshold. Namely, the controller 160 determines whether the time that the data storage device 140 was powered on is over a time threshold. When the life time LTR is greater than the time threshold, the process goes to step S616, otherwise, the process goes to step S624. It should be noted that steps S616~S624 are similar to steps S516~S524. Therefore, for details of steps S616~S624 can be referred to in FIG. 5. It should be noted that, in the maintenance process (steps S604~S624), the controller 160 is further configured to decrease the life time LTR by a second predetermined value or reset the life time LTR to zero. For example, the controller 160 is configured to decrease the life time LTR by a second predetermined value after updating the block(s) having the error bit number(s) which is greater than the error-bit threshold in step S620. When none of the error bit numbers of the blocks B1~BX of the block groups GB1~GBZ is greater than the error-bit threshold, the controller 160 is configured to decrease the life time LTR by a second predetermined value after determining that none of the error bit numbers of the blocks B1~BX of the block groups GB1~GBZ is greater than the error bit threshold (step S618), wherein the second predetermined value is the life time LTR retrieved by step S604, but it is not limited thereto. It should be noted that, in another embodiment, the controller 160 reset the life time LTR to zero after step S604 determines whether the life time LTR is greater than the time threshold. Moreover, in one embodiment, when the controller 160 is further configured to record the current data of the maintenance process into the random access memory 165 and discontinue the maintenance process when the controller 160 receives an operation command during the maintenance process (steps S604~S624). Next, the controller 160 performs the operation in response to the operation command. After the operation is finished, the controller 160 continues the maintenance process according to the current data of the maintenance process stored in the random access memory 165. For example, when the operation command is a second read command, the controller 160 discontinues the maintenance process, performs a second read operation on at least one page in response to the second read command.

Figure 7A:
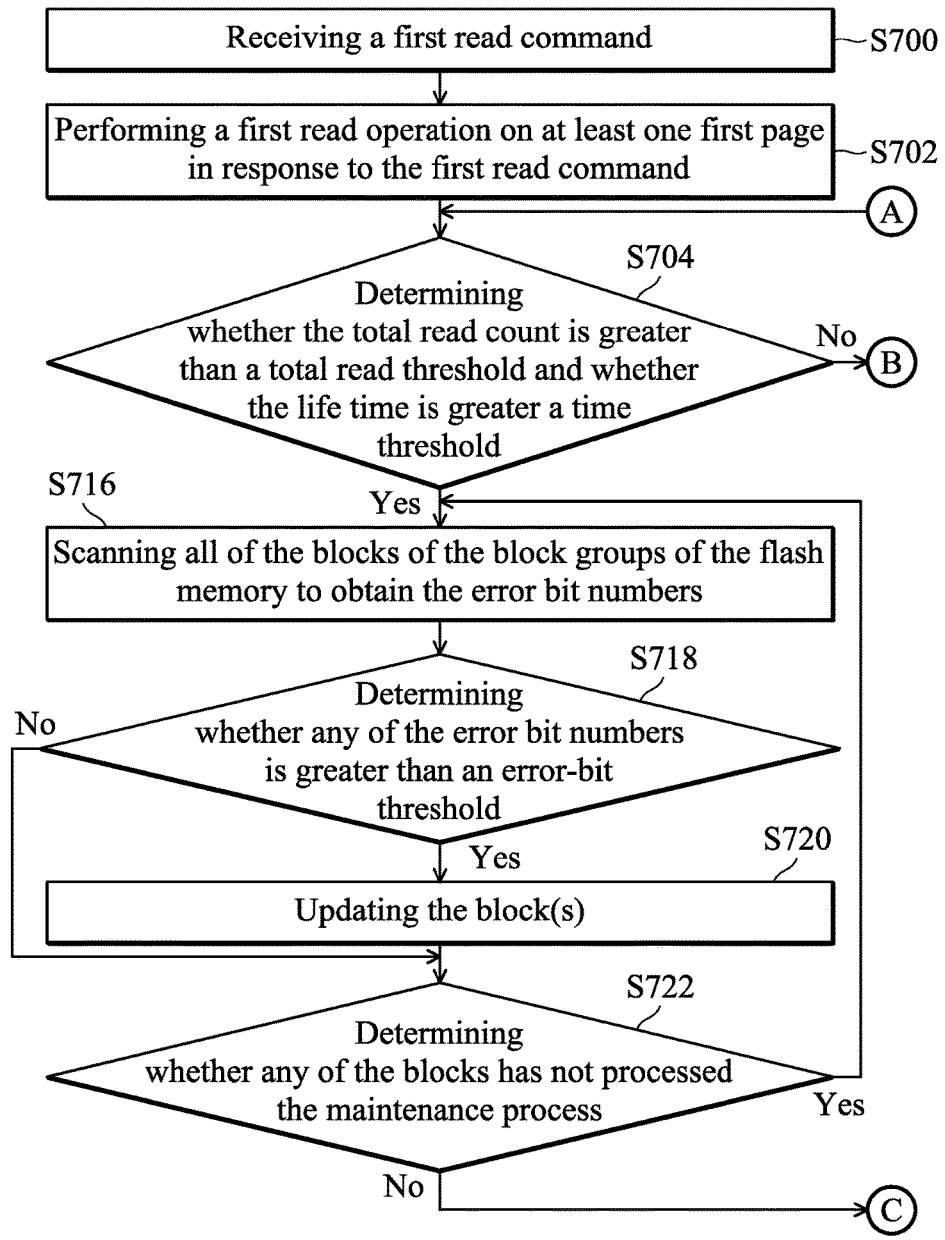
FIGS. 7A-7B are a flowchart of a data maintenance method according to exemplary embodiments.
Figure 7B:
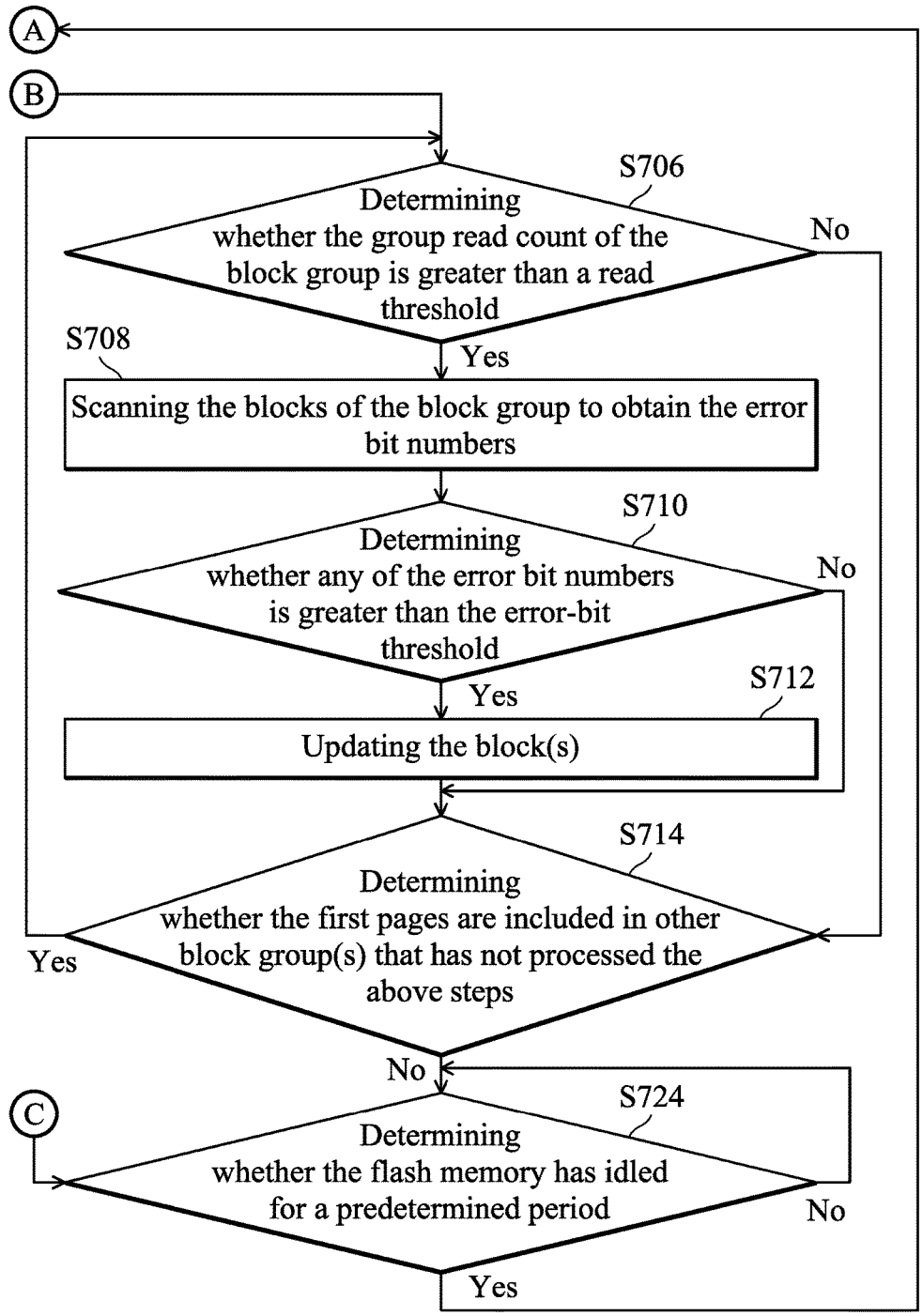

FIGS. 7A-7B are a flowchart of a data maintenance method according to exemplary embodiments. The data maintenance method is applied to the data storage device 140 of FIG. 1. The process starts at step S700.

In step S700, the controller 160 receives a first read command from the host device 120.

Next, in step S702, the controller 160 performs a first read operation on at least one first page in response to the received first read command. Moreover, the controller 160 is further configured to increase the group read count of the first block group including the first pages by a first predetermined value, and increase the total read count TRC by another first predetermined value, wherein one of the first predetermined values is the number of the first pages read by the first read operation, and another first predetermined value is the number of the first pages. It should be noted that the first read command can read the pages included in more than one block or more than one block groups. For example, the controller 160 perform a first read operation on the pages P1~P4 of the block B1 of the block group GB1 in response to the received first read command. The controller 160 increases the group read count RC1 of the block group GB1 by 4 and stores the increased group read count RC1 in the parameter table 200. For another example, the controller 160 performs a first read operation on the pages P1~PY of the block BX of the block group GB1, the pages P1~PY of the block B1 of the block group GB2 and the pages P1~P6 of the block B2 of the block group GB2 in response to the first read command. The controller 160 increases the group read count RC1 of the block group GB1 by Y, increases the group read count RC2 of the block group GB2 by (Y+6), increases the total read count TRC by (Y+Y+6), and stores the increased parameters in the parameter table 200.

Next, the controller 160 performs the maintenance process after the first read operation is finished. First, in step S704, the controller 160 retrieves the total read count TRC and the life time LTR from the parameter table 200 and determines whether the total read count TRC is greater than a total read threshold and whether the life time LTR is greater a time threshold. Namely, the controller 160 is configured to determine whether the number of times that all of the pages of flash memory 180 is greater than a predetermined value (total read count TRC) and whether the time that the data storage device 140 has been powered on is over the time threshold. When the total read count TRC is greater than the total read threshold or the life time LTR is over the time threshold, the process goes to step S716, otherwise, the process goes to step S706. It should be noted that steps S716~S722 are similar to steps S516~S522. The details of steps S716~S722 can be referred to in FIG. 5. Steps S706~S714 are similar to steps S406~S414. The details of steps S706~S714 can be referred to in FIG. 4.

In step S724, the controller 160 determines whether the flash memory 140 has idled for a predetermined period. When the flash memory 140 idles the predetermined period, the process returns to step S704, otherwise, the controller 160 continues to determine whether the flash memory 140 has idled for the predetermined period. It should be noted that, in the maintenance process (steps S704~S724), the controller 160 is further configured to decrease the group read count of the first block group which is greater than the read threshold, the total read count TRC and the life time LTR by a second predetermined value, or reset the group read count of the first block group which is greater than the read threshold, the total read count TRC and the life time LTR to zero, the details can be referred to in FIGS. 4~6. Moreover, in one embodiment, when the controller 160 receives an operation command in the maintenance process (steps S704~S724), the controller 160 is further configured to record the current data of the maintenance process in the random access memory 165 and discontinue the maintenance process. Next, the controller 160 performs the operation in response to the operation command. After the operation is finished, the controller 160 continues the maintenance process according to the current data of the maintenance process stored in the random access memory 165.

The data storage device 140 and the data maintenance method of the present invention can scan the blocks in the background and update the blocks which may not be corrected.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, having a plurality of blocks, and each of the blocks has a plurality of pages; and
a controller, configured to perform a maintenance process in background, wherein in the maintenance process:
the controller is configured to determine whether a total read count is greater than a total read threshold,
if yes, that is, if the total read count is greater than the total read threshold, the controller is configured to scan each of the blocks to obtain a plurality of error bit numbers corresponding to the blocks, and update the block corresponding to the error bit number which is greater than an error-bit threshold.

2. The data storage device as claimed in claim 1, wherein the total read count corresponds to the number of times that all of the pages has been read.

3. The data storage device as claimed in claim 1, wherein the controller is configured to increase the total read count by one when any of the pages is read.

4. The data storage device as claimed in claim 1, wherein the controller is further configured to decrease a predetermined value from the total read count after all of the blocks corresponding to the error bit numbers greater than the error-bit threshold have been updated, wherein the predetermined value is the total read count before the controller scanned the blocks.

5. The data storage device as claimed in claim 1, wherein when none of the error bit numbers is greater than the error-bit threshold, the controller decreases a predetermined value from the total read count, wherein the predetermined value is the total read count before the controller scanned the blocks.

6. The data storage device as claimed in claim 1, wherein the controller is further configured to reset the total read count to zero when the total read count is greater than the total read threshold.

7. A data maintenance method, applied to a data storage device of a flash memory, wherein the flash memory has a plurality of blocks, each of blocks has a plurality of pages, and the data maintenance method comprises:
performing a maintenance process in background, wherein in the maintenance process:
determining whether a total read count is greater than a total read threshold; and
if yes, that is, if the total read count is greater than the total read threshold, scanning each of the blocks to obtain a plurality of error bit numbers corresponding to the blocks, and update the block corresponding to the error bit number which is greater than the error-bit threshold.

8. The data maintenance method as claimed in claim 7, wherein the total read count corresponds to the number of times that all of the pages has been read.

9. The data maintenance method as claimed in claim 7, wherein increasing the total read count by one when any of the pages is read.

10. The data maintenance method as claimed in claim 7, further comprising:
decreasing a predetermined value from the total read count after all of the blocks corresponding to the error bit numbers greater than the error-bit threshold have been updated, wherein the predetermined value is the total read count before scanning the blocks.

11. The data maintenance method as claimed in claim 7, further comprising:
decreasing a predetermined value from the total read count when none of the error bit numbers is greater than the error-bit threshold, wherein the predetermined value is the total read count before the scanning the blocks.

12. The data maintenance method as claimed in claim 7, further comprising resetting the total read count to zero when the total read count is greater than the total read threshold.

13. A data storage device, comprising:
a flash memory, having a plurality of blocks and each of the blocks has a plurality of pages, and the blocks are divided into a plurality of block groups; and
a controller, configured to accumulate a total read count of one of the block groups when one of the block groups is read, configured to determine whether the total read count is greater than a total read threshold in background, and if yes, configured to locate a block in one of the block groups by determining whether an error bit number of the block is greater than an error-bit threshold and update the block in background.

* * * * *